US009983262B1

(12) United States Patent
Trock et al.

(10) Patent No.: US 9,983,262 B1
(45) Date of Patent: May 29, 2018

(54) BUILT-IN SELF TEST CONTROLLER FOR A RANDOM NUMBER GENERATOR CORE

(71) Applicant: AMAZON TECHNOLOGIES, INC., Seattle, WA (US)

(72) Inventors: Dan Trock, Katzrin (IL); Ron Diamant, Albany, CA (US)

(73) Assignee: Amazon Technologies, Inc., Seattle, WA (US)

( * ) Notice: Subject to any disclaimer, the term of this patent is extended or adjusted under 35 U.S.C. 154(b) by 163 days.

(21) Appl. No.: 15/198,217

(22) Filed: Jun. 30, 2016

(51) Int. Cl.
*G01R 31/28* (2006.01)
*G01R 31/317* (2006.01)
*G01R 31/3187* (2006.01)
*G01R 31/3177* (2006.01)
*G01R 31/3185* (2006.01)

(52) U.S. Cl.
CPC ... *G01R 31/31724* (2013.01); *G01R 31/3177* (2013.01); *G01R 31/3187* (2013.01); *G01R 31/31853* (2013.01); *G01R 31/318525* (2013.01)

(58) Field of Classification Search
CPC .......... G01R 31/31724; G01R 31/3177; G01R 31/31853; G01R 31/318525; G01R 31/318527; G01R 31/318522; G01R 31/318533; G01R 31/318536; G01R 31/318538; G01R 31/318541; G01R 31/318544; G01R 31/318547; G01R 31/31855; G01R 31/318
USPC ....... 714/733, 734, 728–729, 726, 727, 731, 714/744, 30; 324/763, 765, 527, 512; 377/69, 72, 64
See application file for complete search history.

(56) References Cited

U.S. PATENT DOCUMENTS

| | | | |
|---|---|---|---|
| 2003/0154434 A1* | 8/2003 | Hou | G11C 29/44 714/734 |
| 2011/0296265 A1* | 12/2011 | Rakheja | G01R 31/318558 714/731 |
| 2017/0097388 A1* | 4/2017 | Parasrampuria | G01R 31/318385 |
| 2018/0024192 A1* | 1/2018 | Sinha | G01R 31/31703 |

\* cited by examiner

*Primary Examiner* — Christine Tu
(74) *Attorney, Agent, or Firm* — Blank Rome LLP

(57) ABSTRACT

A device includes one or more random number generator (RNG) cores (e.g., true random number generator cores) and a built-in self-test controller (BIST) configured to perform various fault tests on each RNG core. The tests include a stuck-at-1 fault test, a stuck-at-0 fault test, and a transition delay fault test. For those RNG cores that have multiple ring oscillators, each individual ring oscillator is fault tested by the BIST controller. For those RNG cores that have a multi-tap inverter chain configuration, the individual taps may be tested by the BIST controller. The RNG core also may comprise a bi-stable cell which can be tested by the BIST controller as well.

20 Claims, 12 Drawing Sheets

US 9,983,262 B1

BUILT-IN SELF TEST CONTROLLER FOR A RANDOM NUMBER GENERATOR CORE

BACKGROUND

The security of many systems, such as cryptographic systems, relies on unpredictability and irreproducibility of digital key-streams that are used for encryption and/or signing of confidential information. There are at least two fundamentally different strategies for generating random bits. One strategy is to compute numbers deterministically using, for example, a software-implemented algorithm that requires an initial input seed value. This class of random number generators is known as Pseudo/Deterministic Random Number Generators (PRNGs/DRNG). PRNGs must be provided with a random initialization value (seed) to produce an output value that resembles a random bit-stream. PRNGs are periodic, although the periods are typically very long.

Another strategy is to produce bits non-deterministically, where every bit of output is based on a physical process that is unpredictable. Such physical processes may be based, for example, on the production of thermal (resistance or shot) noise. This class of Random Number Generators (RNGs) is commonly known as True Random Number Generators (TRNGs). In hybrid RNG implementations, often a TRNG is used to initialize the PRNG (e.g., provide the seed for the PRNG).

BRIEF DESCRIPTION OF THE DRAWINGS

For a detailed description of various examples, reference will now be made to the accompanying drawings in which.

DETAILED DESCRIPTION

Figure 1:
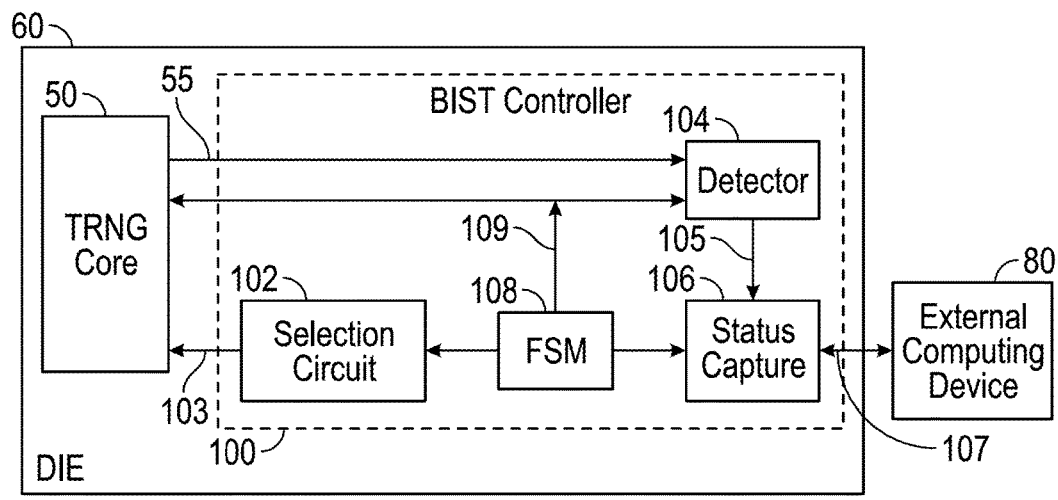
FIG. 1 shows a system in which a TRNG core is coupled to a built-in self-test (BIST) controller to perform one or more fault tests on the TRNG core in accordance with various examples.

Random number generators (RNGs) produce random binary numbers, which may be statistically independent, uniformly distributed and unpredictable. Random numbers are useful in many applications such as cryptography, communications, probabilistic algorithms, and so on. In particular, many cryptographic applications benefit from relatively high entropy. By way of illustration, if a 128-bit key is generated with only 64-bits of entropy then the encrypted value can be guessed on average in $2^{63}$ attempts. However, if 128 bits of entropy are used, then it will take on average $2^{127}$ attempts to guess correctly the encrypted value. Using 128 bits as opposed to 64 bits is a very significant difference, in many cases making it infeasible to correctly guess the encrypted value. As a consequence, many applications benefit from an embedded, high-quality RNG.

As noted above, often a TRNG is used to initialize a PRNG. Regardless of how or why they are used, TRNGs are based on a physical noise source (e.g., radioactive decay, thermal noise or free running jitter oscillators) and depend strongly on the quality of their implementation. Production of high rate and high quality random bit-streams inside logic-devices is challenging because such devices are usually intended for implementing deterministic data processing algorithms, whereas generating true-randomness generally needs some physical nondeterministic process.

Testing a TRNG also is a challenge. A test may be available that can identify whether the output of a TRNG is random enough to meet a specification, but such a test may only be viable for validation of select samples, and not for mass production. Assuming that TRNG design quality can be verified and proven on several good devices, it still may be helpful during production to ensure that all manufactured devices maintain the same level of integrity. Manufacturing defects should be detected with 100% coverage. As a counter-example, consider that one or several entropy sources (e.g., ring oscillator elements) within a TRNG are stuck due to a manufacturing defect (i.e., the output of the ring oscillator is stuck at a certain bit value). These entropy sources will not contribute to the overall entropy of the system compared to a defect-free circuit. Such a bit-stuck ring oscillator will result in lower TRNG quality and may compromise the security of the system, yet go unnoticed due to a partially functional TRNG and a large amount of pseudo-random post-processing.

The embodiments described herein generally are directed to a built-in self-test (BIST) controller that can be used to quickly and efficiently test a TRNG. In some embodiments, the TRNG may be implemented on a semiconductor die and the BIST controller may be integrated onto the same die. In other embodiments, the BIST controller may be implemented separately from the TRNG it is used to test. The disclosed BIST controller can detect "stuck-at faults" such as a stuck-at-1 fault in which the output of a ring oscillator forming the TRNG is stuck at a logic 1, or a stuck-at-0 fault in which the output is stuck at a logic 0. The BIST controller also may detect a transition delay fault with the TRNG in which the TRNG outputs a randomized bit stream at a slower than desired rate. The BIST controller initializes the TRNG for the stuck-at-1 and stuck-at-0 fault tests and monitors the output. The BIST controller counts the number of transitions of the output in a given unit of time to determine whether the TRNG is experiencing a transition delay fault.

As the disclosed BIST controller may be implemented on the same die as the TRNG it is used to test, the BIST controller is fast and suitable for mass production. The BIST controller includes a finite state machine which controls the operation of the fault tests and reports the results, and thus can be activated through assertion of a control signal to the controller. The BIST controller described herein can test TRNGs having any type of entropy source such as ring oscillators, bi-stable cells, etc.

FIG. 1 shows an embodiment in accordance with various examples. A TRNG core 50 is shown coupled to a BIST controller 100. The TRNG core 50 and the BIST controller 100 are provided on a die 60. Thus, in this example, the BIST controller 100 is formed on the same die as the TRNG core it is configured to test, although in other examples the BIST controller 100 and TRNG generate to be tested may be formed on different dies.

The TRNG core 50 may be implemented as a circuit which includes any of a variety of different TRNGs, and some of the various TRNGs are described below and shown in various figures. The BIST controller 100 can be customized to test individual TRNG core implementations or the same BIST controller can be used to test a variety of different TRNG core implementations. Further, in one example, a system includes multiple (and possibly different) TRNG cores and the BIST controller can selectively test each core.

The BIST controller 100 of FIG. 1 includes a selection circuit 102, a detector 104, a status capture circuit 106, and a finite state machine (FSM) 108. The FSM 108 controls the selection circuit to select a portion of the TRNG core 50 to test (e.g., an individual ring oscillator within a multi-ring oscillator TRNG core). How the selection circuit 102 selects the portion of the TRNG to be tested depends on the specific implementation for the TRNG core. Given the TRNG core's implementation, the selection circuit 102 asserts appropriate control signals 103 to the TRNG core to configure the TRNG core for testing of an individual ring oscillator within the TRNG core. The testing may include performance of any or all of a stuck-at-1 fault test, a stuck-at-0 fault test, and/or a transition delay fault test. The resulting output signal 55 from the TRNG core 50 is received by the detector 104 and processed to detect the various fault conditions (e.g., stuck-at-1 fault, stuck-at-0 fault, transition delay fault) and generate test status signals 105. The resulting status signals 105 are captured by the status capture circuit 106. An external computing device 80 such as a test computer can access the status capture circuit and retrieve the fault data, if any, via signals 107.

The FSM 108 controls the operation of the initialization interface and the status capture circuit 106 and asserts initialization signals 109 to the TRNG core 50 and the detector 104. The initialization signals are specific to each fault test being performed, as will be explained in greater detail below. The BIST controller performs the stuck-at-1 fault test, the stuck-at-0 fault test, and the transition delay fault test to be performed on the TRNG core 50. The stuck-at-1 fault test is not performed concurrently with the stuck-at-0 fault test, but the transition delay fault test may (or not) be performed concurrently with the "stuck at" fault tests.

Figure 2:
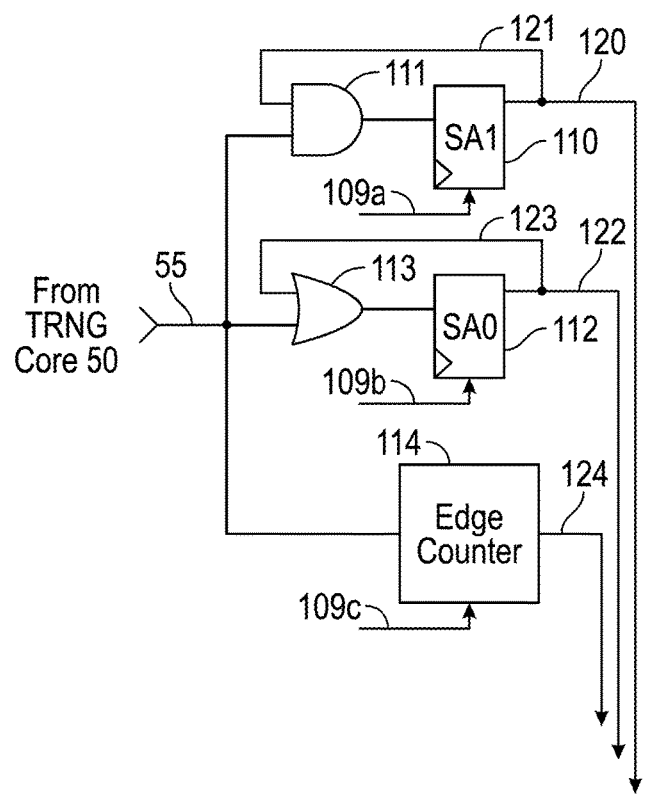
FIG. 2 shows an illustrative embodiment of a detector usable as part of the BIST in accordance with various examples.

Turning to FIG. 2, an illustrated implementation of the detector 104 is shown comprising a stuck-at-1 (SA1) flip flop 110, a stuck-at-0 (SA0) flip flop 112, and an edge counter 114. While flip flops are shown in FIG. 2, any type of detector circuit capable of indicating a stuck-at-0 or a stuck-at-1 logic state is acceptable. The flip flops may be implemented as D-latches or other suitable types of flip flops. The initialization signals 109 from the FSM 108 are provided to the flip flops 110, 112 and edge counter 114 as shown. The FSM 108 asserts an initialization signal 109a to the SA1 flip flop and an initialization signal 109b to the SA0 flip flop. Further, the FSM asserts an initialization signal 109c to the edge counter 114. The initialization signal 109a causes the SA1 flip flop to be initialized to produce a logic 1 state on its output 120 to initialize the SA1 flip flop for the stuck-at-1 fault test. The output 120 of stuck-at-1 flip flop 110 will then transition to a logic 0 when the input transitions from 1 to 0 as will be explained below. The initialization signal 109b causes the SA0 flip flop to be initialized to produce a logic 0 state on its output 122 to initialize the SA0 flip flop for the stuck-at-0 fault test. The initialization signal 109c causes the edge counter to reset its count value to 0. The edge counter counts the number of edges of the signal 55 from the TRNG core 50 (high to low edges, low to high edges, or both types of edges). The output 124 from the edge counter 114 is a value that encodes the number of edges detected.

An AND gate 111 is coupled to the input of the SA1 flip flop. The output of the AND gate 111 is a logic 1 when both of its inputs are logic 1's, otherwise the AND gate's output is a logic 0. One of the AND gate's inputs is the output signal 55 from the TRNG core 50. The other AND gate input is the SA1 flip flop's output via feedback loop 121. When the output from the TRNG core 50 is initialized to a logic 1 and the SA1's output also is initialized to a logic 1, both inputs to AND gate 111 are logic 1s and the input to the SA1 flip flop also is a 1. The output state (logic 1) of the SA1 flip flop 110 remains a logic 1 due, in part, to the self-reinforcing nature of the feedback loop 121. Once the TRNG core output signal 55 transitions from its initialized value of 1 to a logic 0, which will happen unless the TRNG core is experiencing a stuck-at-1 fault, the AND gate input that receives the TRNG core output signal 55 will become a 0 and thus the input to the SA1 flip flop will become a 0 which is then latched through the SA1 flip flop 110 to its output 120. The status capture 106 receives and captures the output of the SA1 flip flop. If the output of the SA1 flip flop does not change from a 1 to a 0, then it is known that the TRNG core 50 has a stuck-at-1 fault.

An OR gate 113 is coupled to the input of the SA0 flip flop 112. The output 122 of the SA0 flip flop is fed back via feedback loop 123 to one of the inputs of OR gate 113, with the other OR gate input being the output signal 55 from the TRNG core 50. To conduct the stuck-at-0 fault test, the SA0 is initialized to 0 (i.e., its output is forced to be a logic 0) and the output of the TRNG core 50 is initialized to a logic 0 state as well. With 0's on both inputs of OR gate 113, the input to the SA0 flip flop 112 also is a 0, and the flip flop's output 122 will remain a 0 due, in part, to the self-reinforcing nature of the feedback loop 123. Once the TRNG core output signal 55 transitions from its initialized value of 0 to a logic 1, which will happen unless the TRNG core is experiencing a stuck-at-0 fault, the OR gate input, which receives the TRNG core output signal 55, will become a logic 1 and thus the input to the SA0 flip flop will become a 1 which is then latched through the SA0 flip flop 112 to its output 122. The status capture 106 also receives and captures the output of the SA0 flip flop. If the output of the SA0 flip flop does not change from a 0 to a 1, then it is known that the TRNG core 50 has a stuck-at-0 fault.

Figure 3:
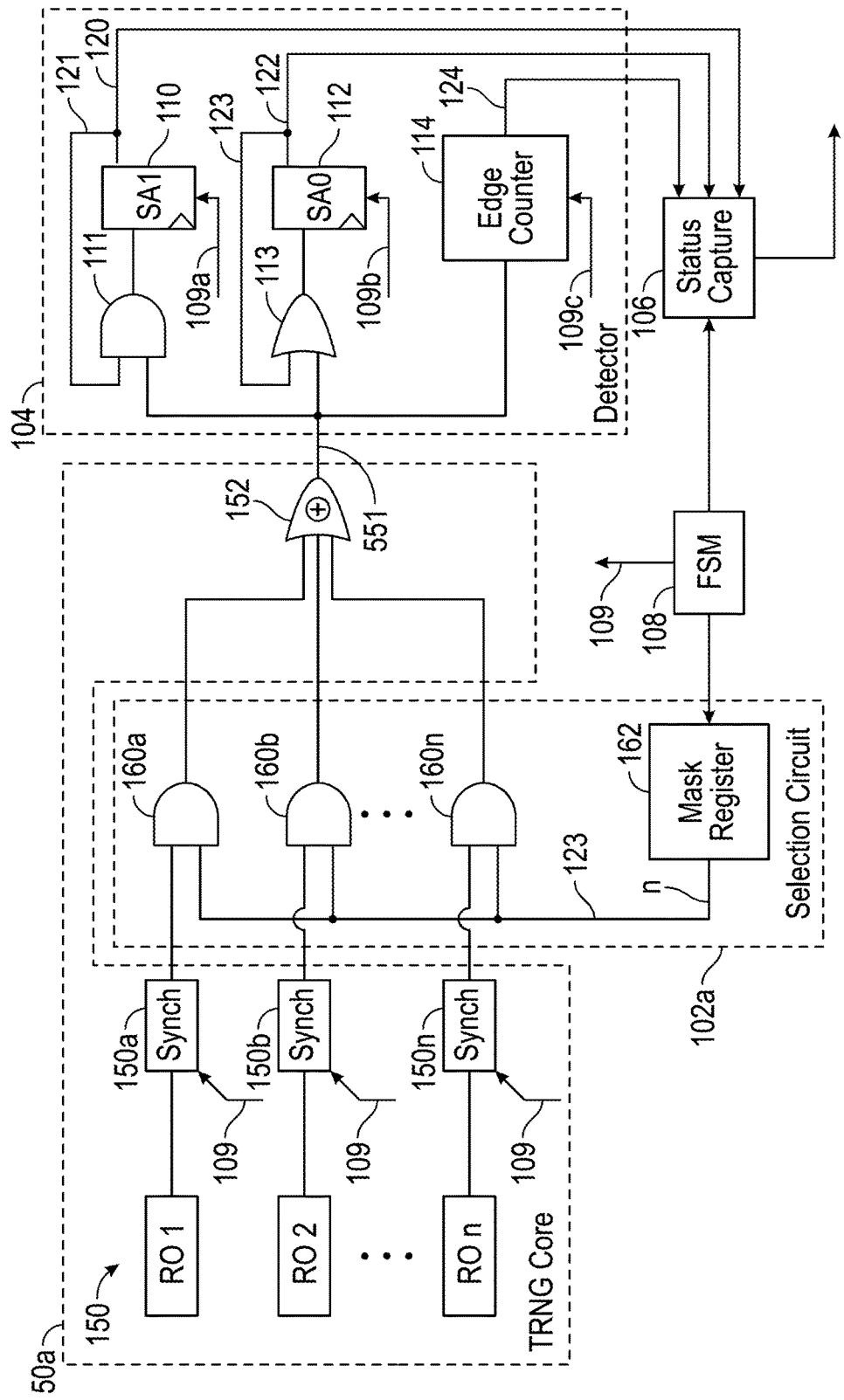
FIG. 3 shows an example of the BIST usable to test a TRNG implemented in a multiple parallel ring oscillator configuration in accordance with various examples.

FIG. 3 shows an example of the use of the BIST controller to test a TRNG core 50*a* that is implemented as a multiple parallel ring oscillator (MPRO). The TRNG core 50*a* of FIG. 3 comprise a number (n) of ring oscillators designated as ring oscillator 1 (RO1), RO2, . . . , ROn and an exclusive-OR (XOR) tree 152. Each ring oscillator may comprise a series-connected chain of inverters, with the last inverter's output connected to the input of the first inverter. Each ring oscillator couples to a synchronizer which may be implemented as one or more series connected D flip flops, or other types of logic circuits. The synchronizers, which may be implemented as series-connected flip flops, eliminates the need for a post-processing stage following the XOR tree 152 (i.e., between the XOR tree and the detector 104) while also eliminating any bias in the output signal from the TRNG 50*a*. The synchronizers advantageously reduce the transition frequency at the input of the XOR tree 152.

The BIST controller in the example of FIG. 3 includes a selection circuit 102*a*, the detector 104, the FSM 108, and the status capture circuit 106. Each ring oscillator is coupled to a synchronizer 150. Thus, RO1 couples to synchronizer 150*a*. RO2 couple to synchronizer 150*b*. ROn couples to synchronizer 150*n*. Each synchronizer 150 is clocked by a clock signal (not shown) to sample the output out of the corresponding ring oscillator.

The selection circuit 102*a* in this example includes multiple AND gates, one AND gate associated with each ring oscillator and synchronizer. The output signal from each synchronizer 150 is provided to an input of a corresponding AND gate. As shown, AND gates 160*a*, 160*b*, . . . , 160*n* correspond to RO1/synchronizer 150*a*, RO2/synchronizer 150*b*, . . . , ROn/synchronizer 150*n*. The output signals from the AND gates 160 are provided to the XOR tree 152, the output of which is a logic 1 only if an odd number of inputs are a 1; otherwise, the output signal from the XOR tree 152 is a logic 0. The output signal from the XOR tree 152 represents the output signal 55 from the TRNG core 50*a* and is provided to the AND gate 111, OR gate 113 and the edge counter 114. In general, any type of entropy source (ring oscillator, bi-stable cells, etc. and combinations thereof) may be coupled through synchronizers 150 and the selection circuit 102*a* to the XOR tree 152.

The selection circuit 102*a* also includes a mask register 162, which can be written by the FSM 108. The FSM 108 tests each of the ring oscillators one at a time. For each ring oscillator, the FSM 108 causes a stuck-at-1 fault test, a stuck-at-0 fault test, and a transition delay test to be performed. To perform the fault testing on a given ring oscillator, the FSM 108 writes a value to the mask register 162 to isolate that particular ring oscillator for testing. In some embodiments, the mask register contains a bit that corresponds with each of the ring oscillators. One (at a time) of the ring oscillators is selected for fault testing by setting the bit corresponding to the desired ring oscillator to a logic 1 and the other bits in the mask register 162 to a 0. The AND gates 160*a*-160*n* mask off all ring oscillator except for the ring oscillator to be tested. The mask register bit for each ring oscillator to be masked off is a 0 which prevents the output of each of those ring oscillators from reaching the XOR tree 152—only the output of the ring oscillator whose mask register bit is a 1 can reach the XOR tree, and the AND gates of the non-selected ring oscillators produce a 0 due to the corresponding mask register bits.

Once a particular ring oscillator is selected for fault testing, to perform a stuck-at-1 fault test, the FSM 108 asserts control signals 109 to initialize the synchronizer 160 corresponding to the ring oscillator to be tested to output a 1 and also initialize the SA1 flip flop 110 to force its output to a 1. For example, if RO1 is to be test, the output of synchronizer 150*a*, which is provided to one input of AND gate 160*a*, is initialized to a 1. The other input to AND gate 160*a* also is a 1 as a result of the value written to the mask register 162 by the FSM 108. Thus, the output of AND gate 160*a* is a 1, which in turn causes the output of the XOR tree 152 also to be a 1. The SA1 flip flop 110 outputs a 1 as a result from its initialization by signal 109*a* from the FSM 108. As a result of the XOR tree outputting a 1 and the output of SA1 being a 1, both inputs to the AND gate 111 are 1's and thus a 1 is provided as an input to the SA1 flip flop.

As RO1 operates following initialization of synchronizer 150*a*, the output of RO1 and thus the output of its synchronizer 150*a* eventually transitions to a 0. The logic 0 value from synchronizer 150*a* causes AND gate 160*a* to output a 0, which in turn forces the output of the XOR tree 152 to be a 0. Because the output of the XOR tree 152 is now a 0, the output of AND gate 111 becomes a 0 which is then latched through the SA1 on to its output 120. The output 120 of the SA1 flip flop thus transitions from 1 (its initialized value) to a 0 (due to correct operation of RO1). If RO1 has a defect that manifests itself as a stuck-at-1 fault, the output from RO1 will not toggle between 1 and 0, and as a result, the output from the SA1 will remain at its initialized value of 1.

A similar process occurs to perform a stuck-at-0 fault test on RO1. The FSM initializes synchronizer 150*a* to output a logic 0, and also initializes the SA0 flip flop 112 to output a logic 0 on its output 122 as well. The feedback loop 123 causes the SA0 output to remain at 0 until RO1 eventually generates a 1, which propagates through AND gate 160*a*, XOR tree 152 and AND gate 111 to cause a 1 to be latched through SA0 on to its output 122. If, however, RO1 is experiencing a stuck-at-0 fault, then the output from RO1 will not toggle between 0 and 1, and as a result, the output from the SA0 will remain at its initialized value of 0.

For the transition delay fault test, the synchronizer 150*a* need not be initialized to any particular value. The edge counter 114, however, is initialized to a 0 count value. The edge counter is then permitted to count the transitions of the TRNG's output signal 55 for a predetermined amount of time (which may be configurable). The edge counter 114 increments its count value with each detected edge on output signal 55. The edge counter is controlled by a start/stop signal from the FSM 108 (included within control signal 109*c*) to count edges for the predetermined time period. The ending count value is provided to and stored in status capture 106. By comparing the total number of counted transitions within a predetermined test time window with a minimum expected threshold, one can determine if RO1 is operating too slowly and has a gross transition delay fault defect. A slow ring oscillator will require a longer warm-up time to accumulate jitter and acquire entropy. The time period during which the edge counter 114 counts and/or the count threshold can be configurable by, for example, the external computing device 80 (e.g., by configuring one or more registers with the BIST controller 100). The FSM 108 reads these registers and uses the values therein to control the various tests. For example, the FSM may assert a control signal to the edge counter to begin and end counting commensurate with the time period previously written to a BIST controller register. The FSM also can assert a control signal to the status capture circuit 106 to read the captured results of the various tests.

In some embodiments, each of these three fault tests (stuck-at-1, stuck-at-0 and transition delay) are performed for one ring oscillator before moving on to test another ring oscillator by writing a different value to the mask register 162. In other embodiments, each fault test is performed sequentially on all of the ring oscillators, and then the next fault test is performed sequentially on all ring oscillators, and so on.

Figure 4:
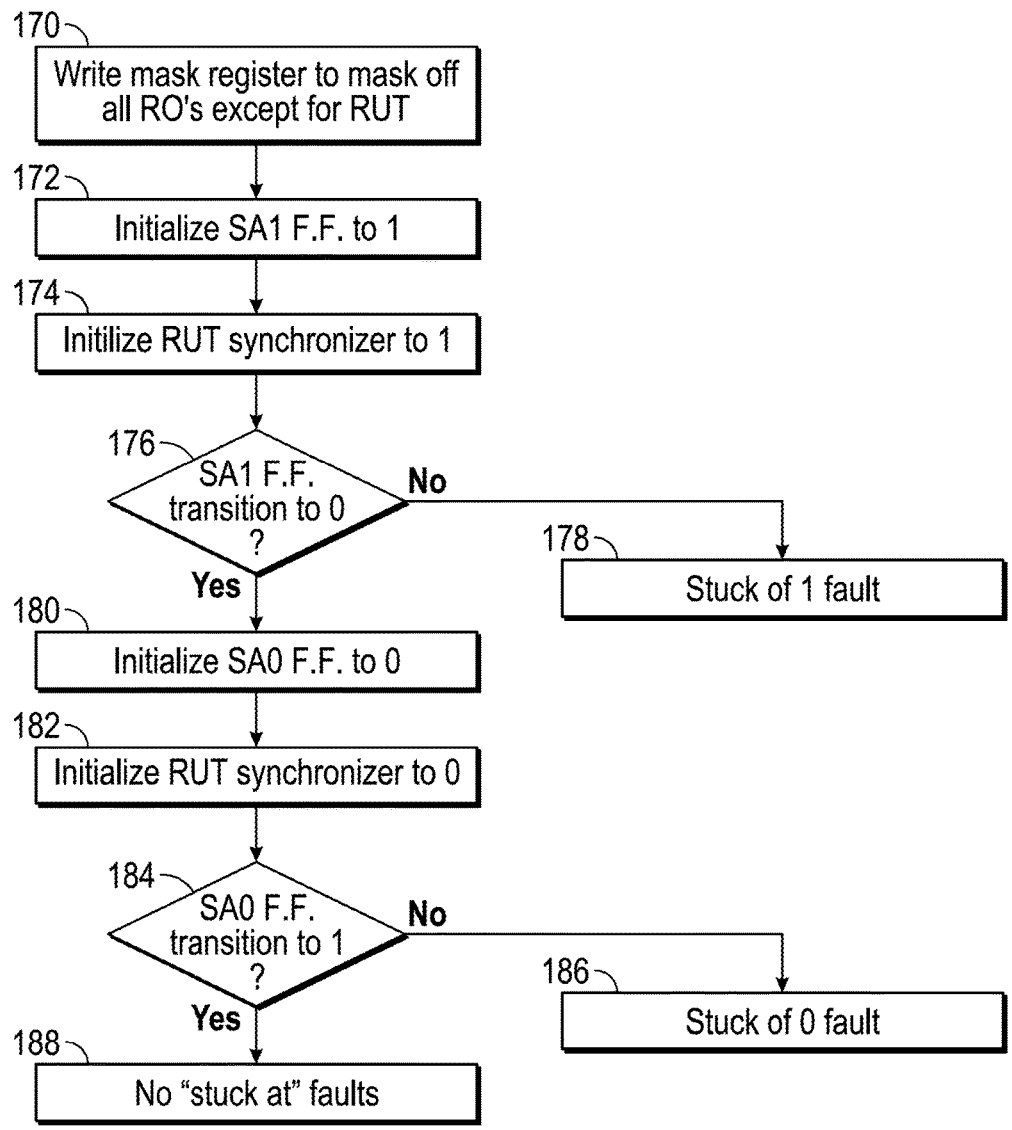
FIG. 4 shows a method for performing "stuck at" fault tests in accordance with various examples.

FIG. 4 shows a method for performing the "stuck at" fault tests of the NITRO TRNG 50a illustrated in the example of FIG. 3. The operations may be performed in the order shown, or in a different order. Further, in some embodiments the operations may be performed sequentially, while in other embodiments two or more of the operations may be performed concurrently.

At 170, the method includes writing the mask register to mask off all of the ring oscillators (or other types of entropy sources as noted above) except for the ring oscillator under test (RUT). In the example in which AND gates are used to select or deselect a given ring oscillator, the mask register is written with a multi-bit value that includes a 1 for the ring oscillator to be tested and 0 for all other ring oscillators.

In the example of FIG. 4, the stuck-at-fault test is performed first, followed by the stuck-at-0 fault test, although the order of the "stuck at" fault tests can be varied from that shown in FIG. 4. At 172, the method includes initializing the SA1 flip flop to a value of 1, and at 174, the synchronizer 150 corresponding to the RUT also is initialized to a value of 1.

At 176, the method includes determining whether the output from the SA1 flip flop changes from a 1 to a 0. The output of the SA1 flip flop may be captured by the status capture circuit 106. The status capture circuit 106, the FSM 108, or an external computing device can access the captured SA1 flip flop output signal to determine its state. A sufficient amount of time is permitted to elapse to ensure that the output of the SA1 flip flop should have changed state absent a stuck-at-1 fault. If the SA1 flip flop has not changed state, then at 178, it is determined that the RUT has a stuck-at-1 fault condition. The external computing device which analyzes the captured bit from the SA1 flip flop (or the FSM 108 or status capture circuit 106 itself) may perform the determination of the stuck-at-1 fault condition per operations 176 and 178. Testing may cease at this point now that it is determined that a stuck-at-1 fault is detected, or control may continue with the stuck-at-0 fault test of operations 180-188.

If, however, it is determined at 176 that the SA1 flip flop has changed state, then there is no stuck-at-1 fault condition and method continues with performing the stuck-at-0 fault test. The SA0 flip flop and the synchronizer 150 corresponding to the RUT are initialized to values of 0 per operations 180 and 182. Then, at 184, the method determines whether the SA0 flip flop output transitions from a 0 to a 1. If no transition is detected, then it is determined that the RUT has a stuck-at-0 fault condition. The external computing device which analyzes the captured bit from the SA0 flip flop (or the FSM 108 or status capture circuit 106 itself) may perform the determination of the stuck-at-0 fault condition per operations 184 and 186. If a transition in the output of the SA0 flip is detected, then the RUT has passed the stuck-at-0 fault test (188 indicates that neither "stuck at" fault has been detected).

Figure 5:
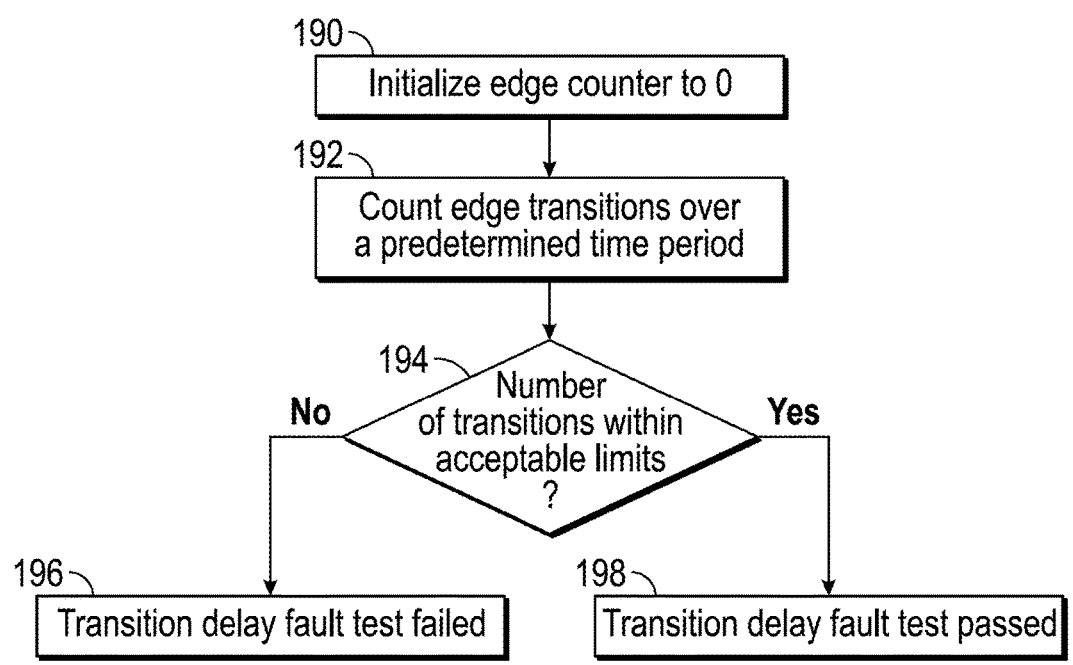
FIG. 5 shows a method for performing a transition delay fault test in accordance with various examples.

FIG. 5 shows a method for performing the transition delay fault test. The operations may be performed in the order shown, or in a different order. Further, in some embodiments the operations may be performed sequentially, while in other embodiments two or more of the operations may be performed concurrently.

At 190, the edge counter 114 is initialized to a count value of 0 by, for example, the FSM 108. At 192, the method includes counting transitions of the RUT's output signal over a predetermined period of time. At 194, the method includes a determination as to whether the number of transitions is within acceptable limits as explained above. If not, a transition delay fault is determined to exist at 196. Otherwise, no transition delay fault is determined at 198. The external computing device may obtain and compare the count value captured by the status capture circuit 106 to a threshold value to make this determination (or the FSM 108 or status capture circuit 106 itself may make the determination).

If the testing process determines that any of the fault tests fail, an alert may be generated (e.g., audible alert, visual alert, etc.). The device containing the TRNG core being tested may be reprocessed if possible and desirable, thrown away and dealt with any other suitable manner.

Some or all of the principles described above with regard to the MPRO TRNG core 50a in the example of FIG. 3 apply to the other embodiments of TRNGs described herein and thus are not repeated herein. For example, that each ring oscillator in FIG. 3 can have all three fault tests performed before testing another ring oscillator, or that each test is performed on all ring oscillators before moving on to perform the next test is applicable to any of the embodiments described herein.

Figure 6:
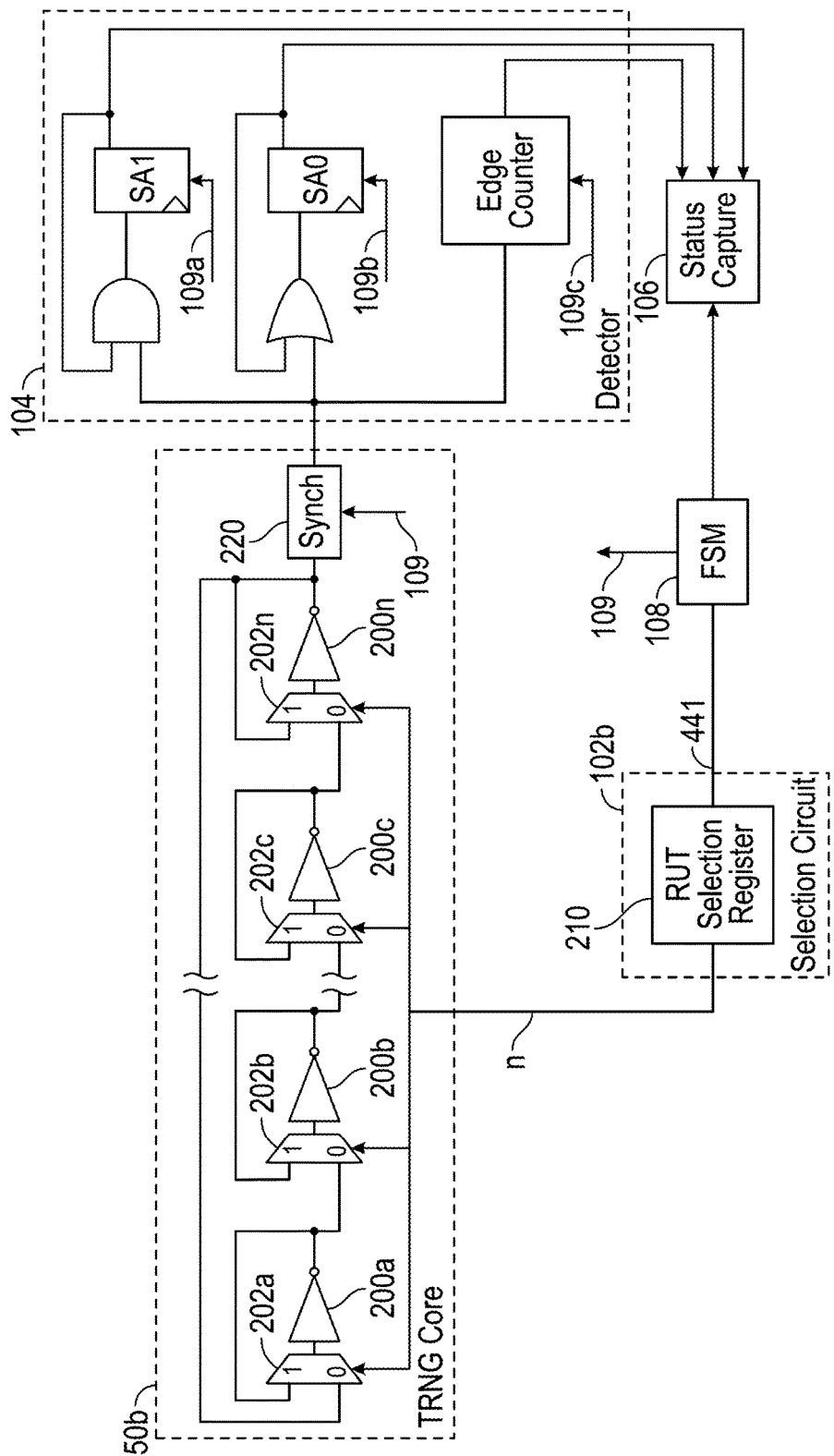
FIG. 6 is an electrical diagram of the BIST controller configured to test a TRNG core implemented as a meta-stable-based entropy source in accordance with another example.

FIG. 6 is directed to an embodiment in which the BIST controller is configured to perform fault testing on a TRNG core 50b implemented as a metastable-based entropy source. In this example the TRNG core 50b comprises a series of inverters 200a, 200b, 200c, . . . , 200n that can either be concatenated to form a single oscillator or be arranged in multiple short, single element rings forcing short-swing oscillations around the meta-stability point of the inverters. The multiplexers 202a, 202b, 202c, . . . , 202n are controlled to implement either the single oscillator comprising all of the inverters or individual rings. A multiplexer 202 is provided on the input of each corresponding inverter. The multiplexer can be controlled to provide to the inverter's input either the inverter's output or the output of the preceding inverter, with the output of the last inverter 200n fed back to the multiplexer 202a of the first inverter 200a. By selecting the "0" input of each multiplexer, all of the inverters 200a-n can be implemented as one large ring oscillator. By selecting a "1" input of a given multiplexer 202, the corresponding inverter 200 forms an individual ring oscillator. The TRNG core 50b also includes a synchronizer 220, which may be implemented as the synchronizer described above.

In order to achieve full test coverage, the full ring oscillator (all inverters operatively coupled together in series via the multiplexers,) as well as each of the short ring oscillators (comprising individual inverters), is tested individually in the disclosed embodiments. In order to sensitize the path from each individual short RUT (single inverter), the multiplexer corresponding to that inverter is set to its "1" input to configure that inverter as a single inverter ring oscillator. All other multiplexers may be set to their "0" input. The selection circuit 102b in this embodiment includes a RUT selection register 210 which can be written by the FSM. Each bit in the value written to the register may map to a corresponding multiplexer 202a-202n. In some embodiments, writing a value to the RUT selection register so that a given bit is a 1 causes the corresponding multiplexer to be select to its "1" input. By contrast, setting the bit to a 0 causes the corresponding multiplexer to be select to its "0" input.

As was the case with the embodiment of FIG. 3, the FSM 108 in the embodiment of FIG. 6 can assert initialization signals 109 to initialize the synchronizer 220 as well as the SA1 flip flop, SA0 flip and edge counter of the detector 104. These components are initialized to perform the stuck-at-1, stuck-at-0, and transition delay fault tests as described above. For example, to test the individual ring oscillator comprising inverter 200b, multiplexer 202b is configured to its 1 input and all other multiplexers are configured to their 0 input. As such, inverter 200b is configured as a single inverter oscillator ring due to the feedback of its output through the "1" input of its multiplexer 202b to the inverter's input. The other inverters between inverter 200b and the synchronizer 220 (i.e., inverters 200c, . . . , 200n) are configured by their multiplexers 202a, . . . , 202n for bypass mode to couple the RUT (inverter 200b) to the synchronizer 220. The synchronizer 220, SA1 flip flop, SA0 flip and edge counter then are initialized and the various fault tests can be performed much as described above. This process may be repeated for each individual single inverter ring oscillator, as well as the full ring oscillator comprising all of the inverters.

Figure 7:
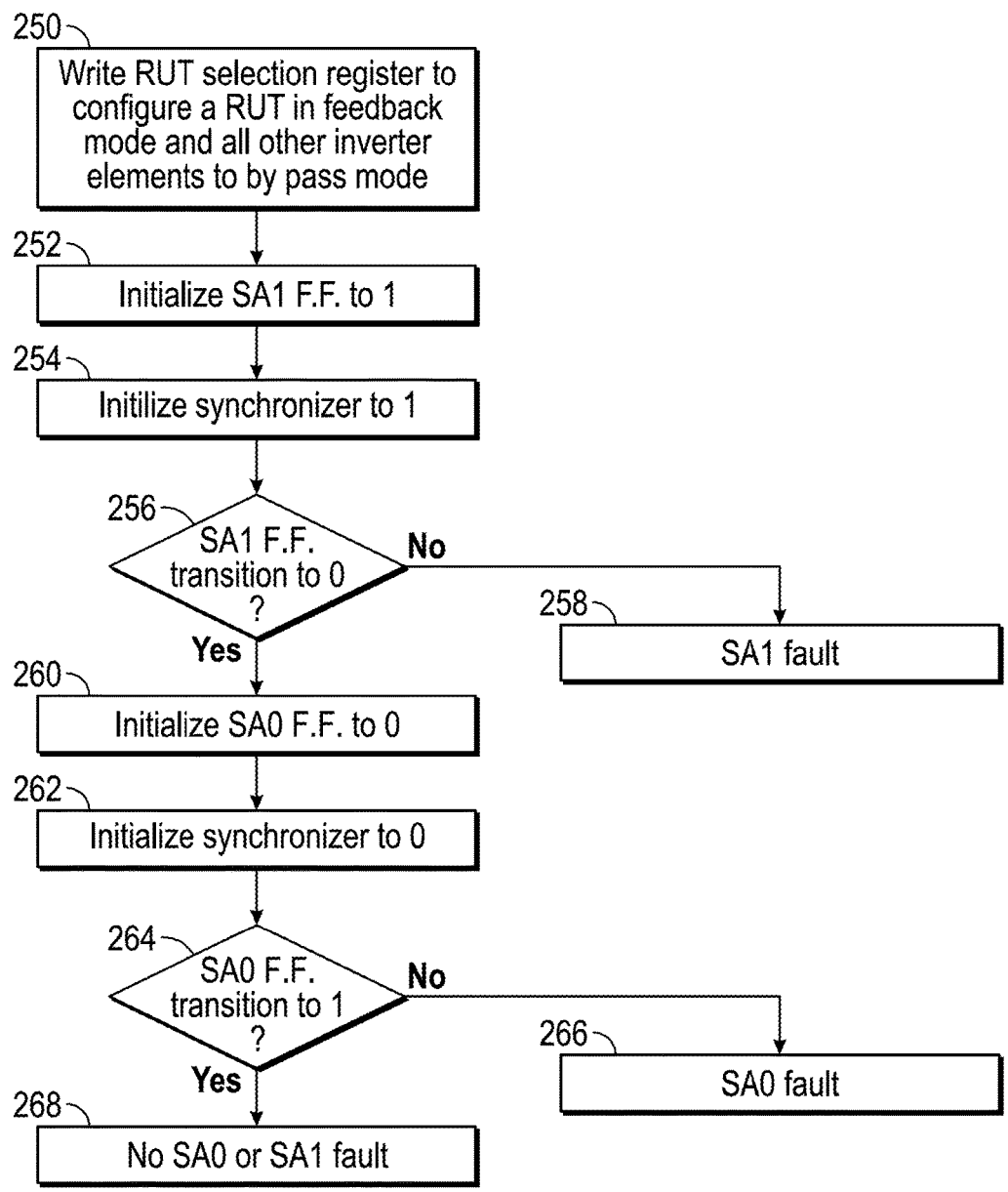
FIG. 7 shows a method for performing "stuck at" fault tests in accordance with the example of FIG. 6.

FIG. 7 illustrates a method for performing "stuck at" fault testing on the TRNG core 50b in the example of FIG. 6. The operations shown are for testing a single ring oscillator element (either a single inverter ring oscillator or a full ring oscillator comprising all of the inverters). The operations may be performed in the order shown, or in a different order. Further, in some embodiments the operations may be performed sequentially, while in other embodiments two or more of the operations may be performed concurrently.

At 250, the method includes writing the RUT selection register 210 to configure a particular inverter as a RUT in the feedback mode (output of inverter fed back to its input via the multiplexer). All other inverters are configured to bypass mode. The FSM 108 may perform this operation by writing an appropriately configured value to the RUT selection register 210 as explained above.

In the example of FIG. 7, the stuck-at-fault test is performed first, followed by the stuck-at-0 fault test, although the order of the "stuck at" fault tests can be varied from that shown in FIG. 7. At 252, the method includes initializing the SA1 flip flop in the detector 104 to a value of 1, and at 254, the synchronizer 220 also is initialized to a value of 1.

At 256, the method includes determining whether the output from the SA1 flip flop changes from a 1 to a 0. The output of the SA1 flip flop may be captured by the status capture circuit 106. The static capture circuit 106, the FSM 108, or an external computing device can access the captured SA1 flip flop output signal to determine its state. A sufficient amount of time is permitted to elapse to ensure that the output of the SA1 flip flop should have changed state absent a stuck-at-1 fault. If the SA1 flip flop has not changed state, then at 258, it is determined that the RUT has a stuck-at-1 fault condition. The external computing device which analyzes the captured bit from the SA1 flip flop (or the FSM 108 or status capture circuit 106 itself) may perform the determination of the stuck-at-1 fault condition per operations 256 and 258. Testing may cease at this point now that it is determined that a stuck-at-1 fault is detected, or control may continue with the stuck-at-0 fault test of operations.

If, however, it is determined at 256 that the SA1 flip flop has changed state, then there is no stuck-at-1 fault condition and method continues with performing the stuck-at-0 fault test. The SA0 flip flop and the synchronizer 220 are initialized to values of 0 per operations 260 and 262. Then, at 264, the method determines whether the SA0 flip flop output transitions from a 0 to a 1. If no transition is detected, then it is determined that the RUT has a stuck-at-0 fault condition. The external computing device which analyzes the captured bit from the SA0 flip flop (or the FSM 108 or status capture circuit 106 itself) may perform the determination of the stuck-at-0 fault condition per operations 264 and 266. If a transition in the output of the SA0 flip is detected, then the RUT has passed the stuck-at-0 fault test (268 indicates that neither "stuck at" fault has been detected). The transition delay fault test also may be performed much as described previously.

Figure 8:
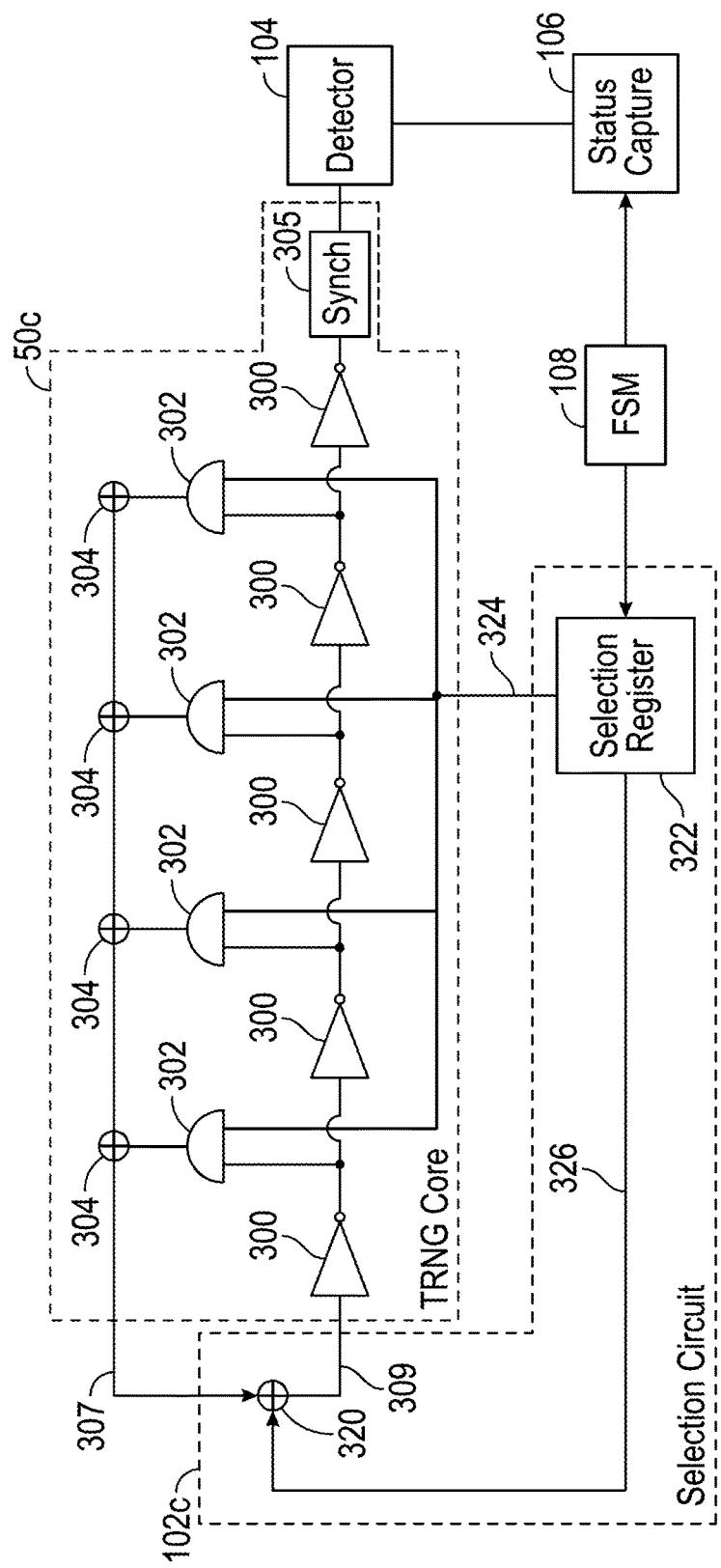
FIG. 8 shows an electrical diagram of the BIST controller configured to test a TRNG core implemented as another type of entropy source in accordance with various examples.

FIG. 8 shows another embodiment of a TRNG core 50c. In this embodiment, the TRNG core 50c comprises a series of inverters 300 configured in a feedback network comprising AND gates 302 and XOR gates 304. A synchronizer 305 also included on the output of the last inverter before the detector 104. The network of multiple combinatorial feedback signals contributes to excellent jitter build-up and fast entropy acquisition.

The selection circuit 102c includes a feedback XOR gate 320 and a selection register 322. The FSM 108 can write a value to the selection register 322 to cause the selection register to configure the various AND gates 302. Each AND gate 302 can be configured to couple an output of an inverter 300 to a corresponding XOR gate 304 or to force a logic 0 signal into the XOR gate 304 via the AND gate. The selection register 322 generates individual control signals 324 to the various AND gates 302 as well as a signal 326 to the XOR gate 320 based on the value written by the FSM. The value may comprise multiple bits, each bit corresponding to a desired state of one of the AND gates 302 and signal 326 to the XOR gate 320. In the example of FIG. 8, five inverters 300 are shown connected in series, but the number of inverters can be other than 5, but generally should be an odd number of inverters.

As explained below, the XOR gate 320 is used to impose an extra inverting stage in the feedback loop when testing an even tap (i.e., a ring formed from an even number of inverters 300) and not to include an extra inverting stage when testing an odd tap (i.e., a ring formed from an odd number of inverters 300). The inputs to XOR gate 320 include signal 326 and the signal 307 from the XOR gate 304, and the output 309 from XOR gate 320 is provided as an input to the first inverter 300 as shown. If the logic level of signal 326 is a logic 0, then the logic level of the output 309 will equal the logic level of the other XOR gate input 307. If the logic level of signal 326 is a logic 1, then the logic level of the XOR gate output 309 will be of the opposite polarity as the logic level of input 307. Thus, imposing a logic 1 on an input to the XOR gate 320 essentially causes the XOR gate's output to be an inverted version of input signal 307. An XOR gate is used to selectively impose an extra inverting stage in the embodiment of FIGS. 8-13. In other embodiments, however, a multiplexer could be used instead of an XOR gate. In such embodiments, one input of the multiplexer would be an inverting input and other input would be a non-inverting input.

Figure 9:
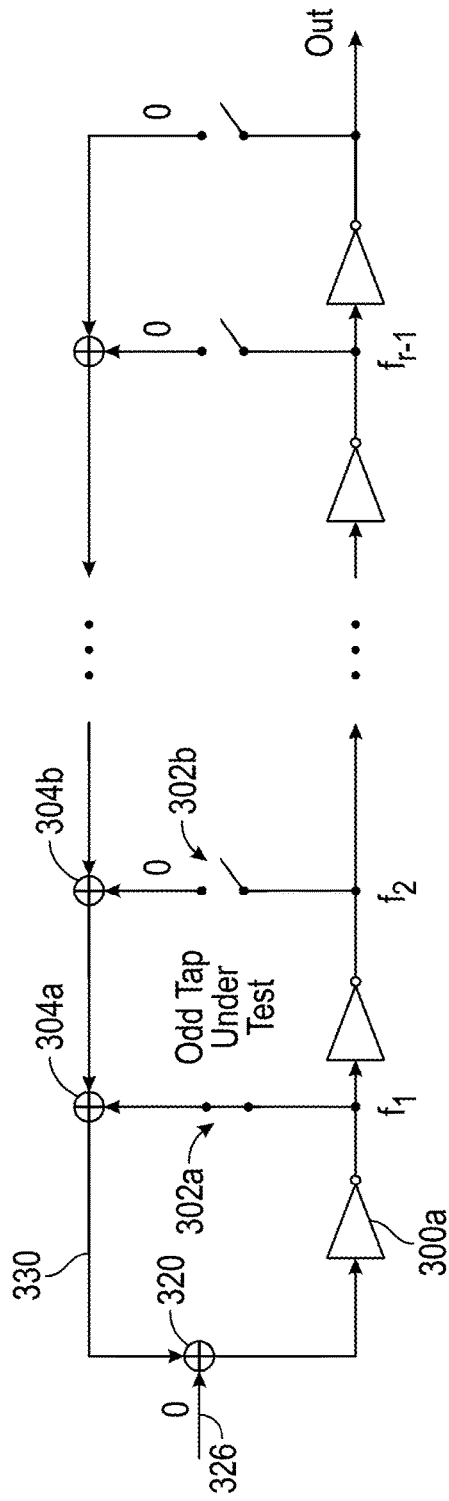
FIG. 9 shows a configuration for the TRNG core of FIG. 8 configured for testing an odd tap in accordance with an embodiment.

FIG. 9 shows the configuration for performing fault testing on an odd number tap. The AND gates from FIG. 8 are shown in FIG. 9 (and FIG. 10 as well) as open or closed switches for convenience. An AND gate for which the control signal 324 is a 1 is illustrated as a closed switch and an AND gate for which the control signal is a 0 is illustrated as an open switch with a logic 0 on the input to the corresponding XOR gate 304. Because an odd number tap has an odd number of inverters included in the ring, the input signal 326 to XOR gate 320 is set to a logic 0 to avoid adding an extra inverting stage. Further, switch 302a is configured to its closed state to form the feedback loop through XOR gate 304a. The output signal from inverter 300a is provided through the rest of the inverters to the detector 104 for monitoring for the various fault tests discussed above.

Figure 10:
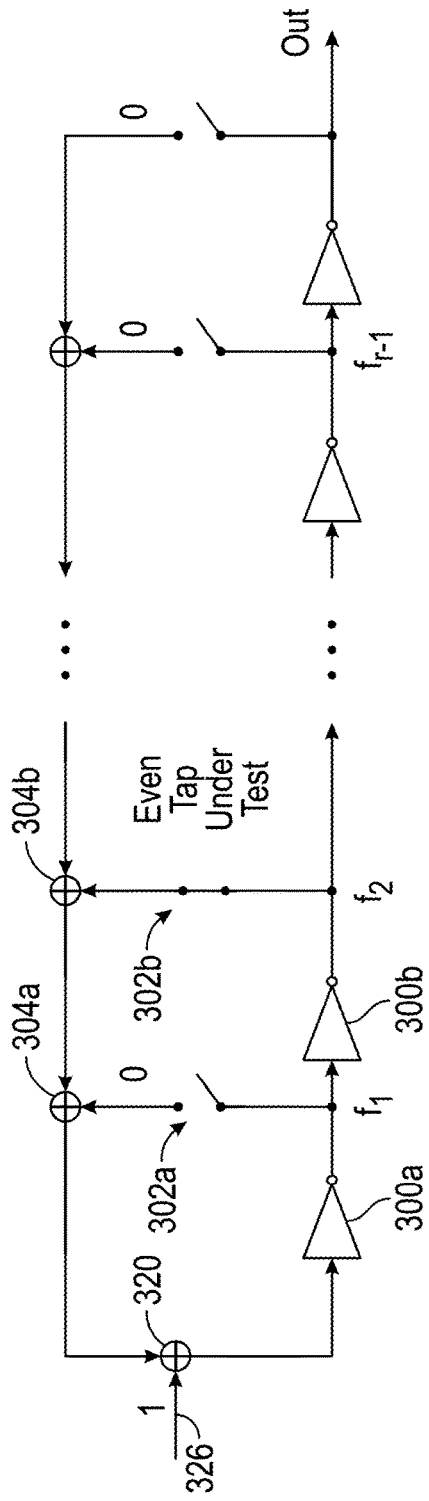
FIG. 10 shows a configuration for the TRNG core of FIG. 8 configured for testing an odd tap in accordance with an embodiment.

FIG. 10 shows a configuration for performing fault testing on an even number tap. An even number of inverters does not function as a ring oscillator and thus the signal 326 is set to a logic level of 1 to cause an extra inversion stage to be added by XOR gate 320 to thereby create an odd number of inverting stages. In the example of FIG. 10 in which the first two inverters 300a and 300b form the ring oscillator, switch 302a is configured to be in its open state and switch 302b is configured to its closed state. The output signal from inverter 300b is provided through the rest of the inverters to the detector 104 for monitoring for the various fault tests discussed above.

Figure 11:
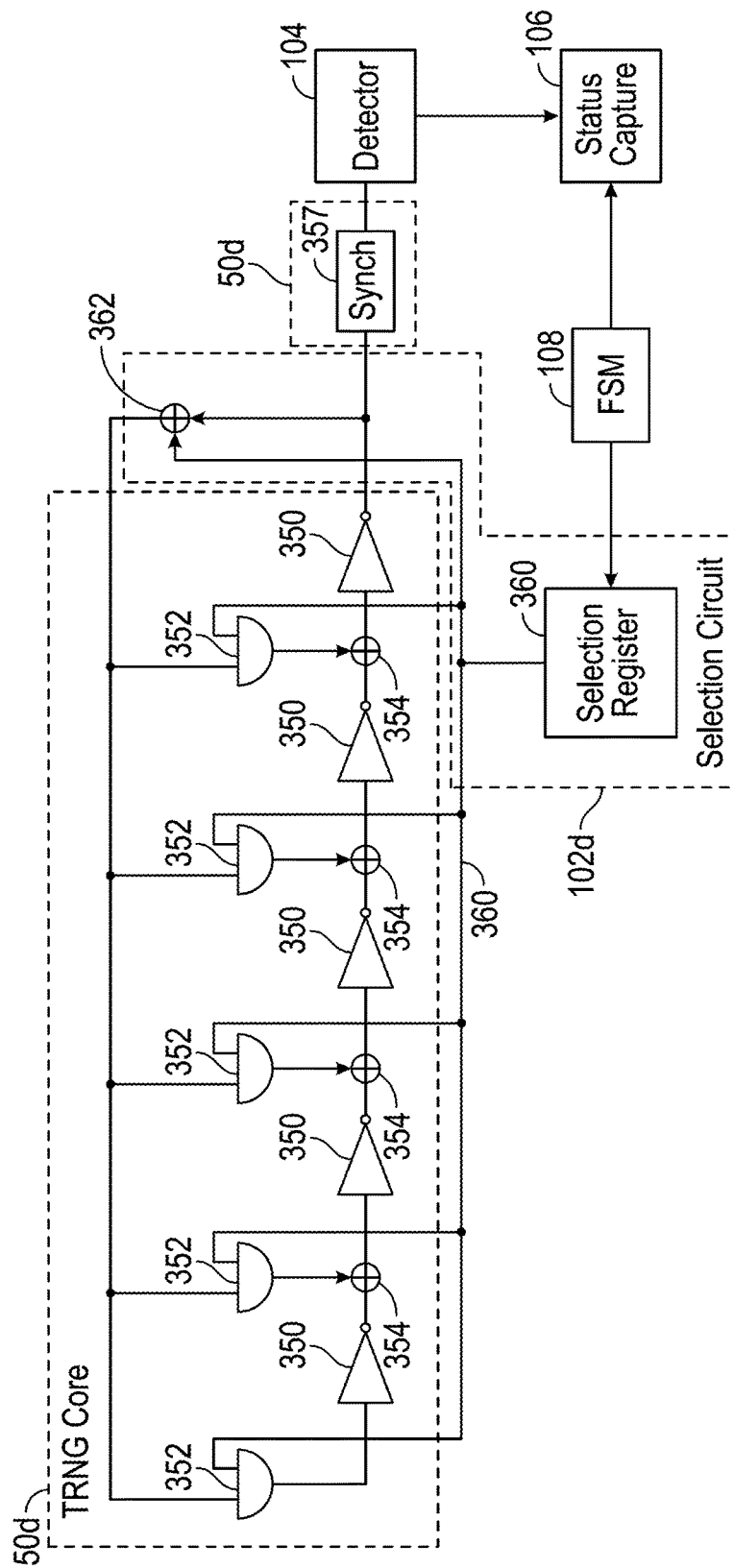
FIG. 11 shows an electrical diagram of the BIST controller configured to test a TRNG core implemented as yet another type of entropy source in accordance with various examples.

FIG. 11 shows another embodiment of a TRNG core 50d. In this embodiment, the TRNG core 50d comprises a series of inverters 350 configured in a feedback network comprising AND gates 352 and XOR gates 354. An XOR gate 354 is provide between each adjacent pair of inverters 350 as shown. A synchronizer 362 also is included on the output of the TRNG core 50d and is used as described above. As with the embodiment of FIG. 8, the network in FIG. 11 of multiple combinatorial feedback signals contributes to excellent jitter build-up and fast entropy acquisition.

The selection circuit 102d includes an XOR gate 362 and a selection register 360. The XOR gate 362 is used in a similar way as XOR gate 320 described above. The FSM 108 can write a value to the selection register 360 to cause the selection register to control the output logic level of AND gates 352 and the state of an input to the XOR gate 362 through a control bus 366. The AND gates 352 are configurable to couple together the XOR gates 354 and inverters 350 to form individual rings. The arrangement of taps for feedback may be expressed as a polynomial function and the control bus 366 also comprises control signals from the selection register 360 representing the polynomial coefficients sets the active feedback taps.

To achieve full test coverage, each feedback path is tested individually. The FSM 108 writes a value to the selection register 360 to thereby cause one tap a time to be selected for testing. For odd taps, only the tap under test is set to the active state. For even taps, the tap under test will be set active and the path is routed through an additional inverting stage implemented by XOR gate 362, as described above. For the path for odd taps the XOR gate 362 does not introduce an extra inverting stage. The mask register controls the logic state of an input signal to the XOR gate 362. In the example of FIG. 11, five inverters 300 are shown connected in series, but the number of inverters can be other than 5, but generally should be an odd number of inverters.

Figure 12:
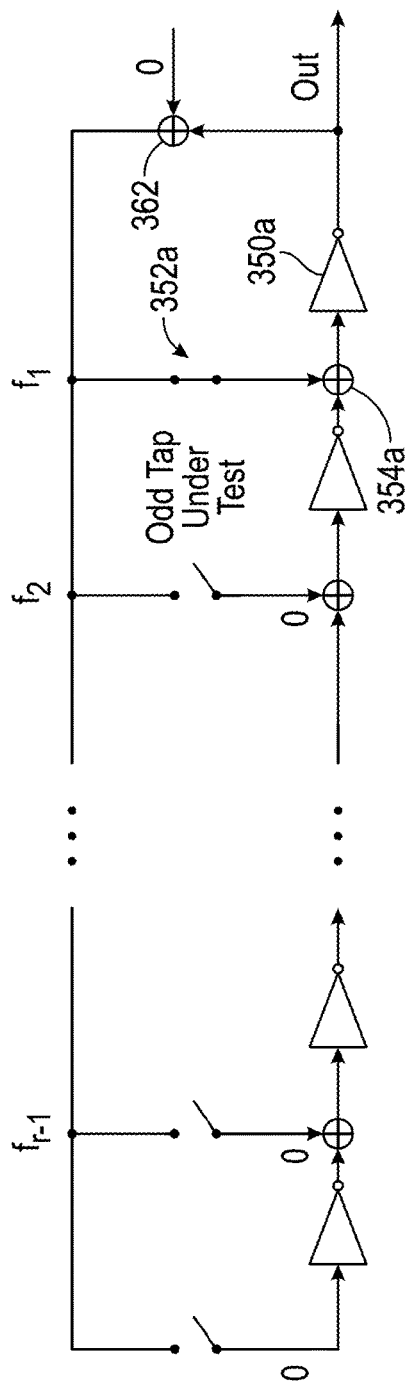
FIG. 12 shows a configuration for the TRNG core of FIG. 11 configured for testing an odd tap in accordance with an embodiment.

FIG. 12 shows the configuration for performing fault testing on an odd number tap (i.e., a ring formed from an odd number of inverters). The AND gates 352 are illustrated as open or closed switches as was the case for FIGS. 9 and 10.

In the example of FIG. 12, the AND gate 352a and XOR gate 362 are configured to implement a single inverter ring comprising the first inverter 350a. The XOR gate 362 is configured not to add an extra inverting stage due to its input signal from the selection register being a logic "0." The output signal from inverter 350a is provided to the detector 104 for monitoring for the various fault tests discussed above.

Figure 13:
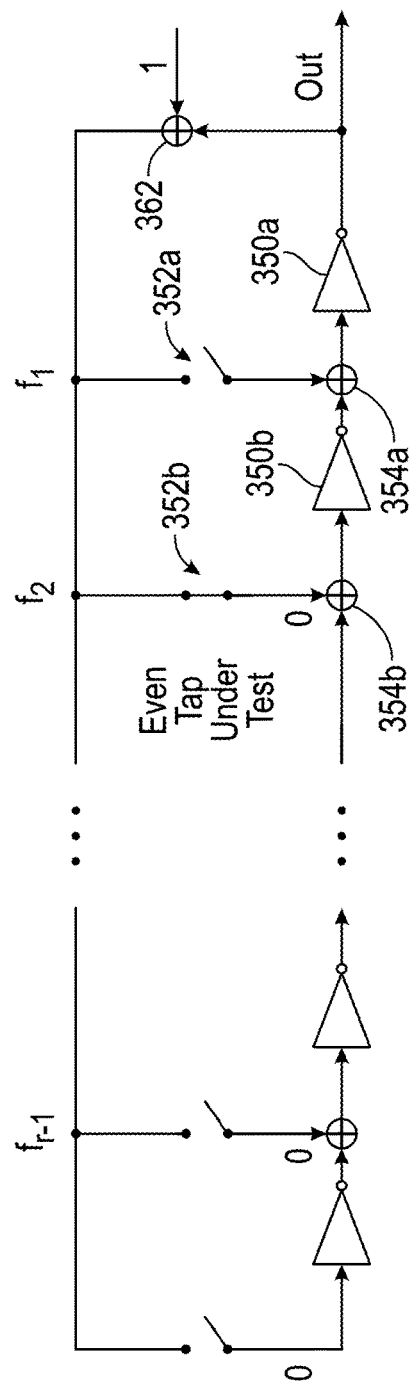
FIG. 13 shows a configuration for the TRNG core of FIG. 11 configured for testing an even tap in accordance with an embodiment.

FIG. 13 shows a configuration for performing fault testing on an even number tap (i.e., a ring formed from an even number of inverters 350). An even number of inverters does not function as a ring oscillator and thus XOR gate 362 is configured to add an extra inverting stage by the selection register imposing a logic "1" on its input as shown to thereby create an odd number of inverting stages. In the example of FIG. 13 in which the first two inverters 350a and 350b form the ring oscillator, AND gate 352a is configured to be in its open state and AND gate 352b is configured to its closed state. The output signal from this ring (i.e., output of inverter 350a) is provided to the detector 104 for monitoring for the various fault tests discussed above.

Figure 14:
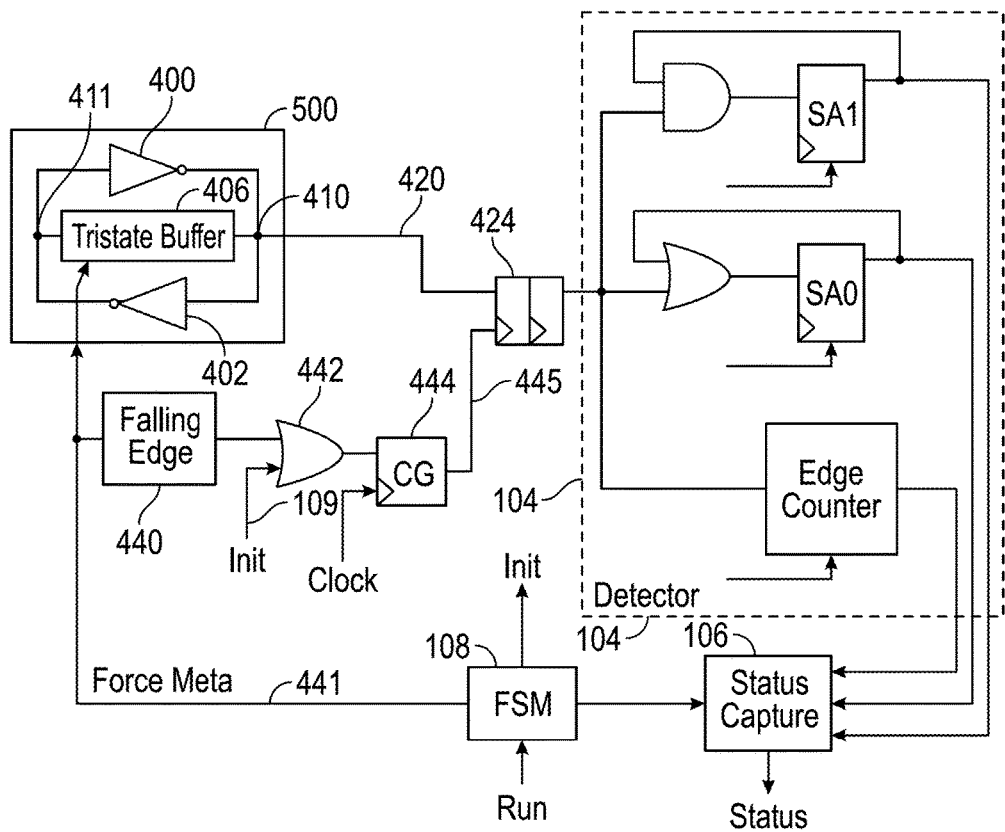
FIG. 14 is a block diagram of the BIST controller configured to test a TRNG core implemented as a bi-stable cell in accordance with various examples.

FIG. 14 is an embodiment in which the TRNG 50e is implemented as a bi-stable cell. The bi-stable cell comprises a pair of inverters 400 and 402 with the output of each inverter connected to the input of the other inverter. The bi-stable cell also includes a tri-state buffer 406 that is configurable by a signal from the FSM 108 to be in one of two states. In one state, the tri-state buffer is an open circuit between nodes 410 and 411. In another state, the tri-state buffer shorts together nodes 410 and 411. When the tri-state buffer 406 is in the short circuit state, the bi-stable cell achieves a metastable state. That is, the output 420 of the cell is neither a high nor a low and instead is an intermediate value between the high and low voltage levels. When the state of the tri-state buffer is then changed to the open circuit state, the bi-stable cell collapses to one logic state or the other with a random occurrence. That is, the output signal from the cell may be a 0 or a 1. The collapsed state of the cell is self-reinforcing, and thus stable. For example, if the output of inverter 400 becomes a 0 following configuration of the tri-state buffer 406 to the open circuit state, then the input of inverter 402 also is a 0 and the output of inverter 402 becomes a 1. Since the output of inverter 402 is also connected to the input of inverter 400, then the input of inverter 400 also is a 1, which reinforces its 0 output. With random occurrence, the bi-stable cell also may have collapsed to the state in which the output of inverter 400 (and thus the output 420 of the cell) becomes a 0. To produce a random bit, the tri-state buffer 406 is forced to its short circuit state to force the cell into meta-stability. The tri-state buffer 406 is then switches to its open circuit state which results in the output 420 becoming a 0 or a 1.

With the previous TRNG embodiments based on inverter ring oscillators, the synchronizers sample an oscillatory signal to automatically produce a series of randomized output bits. The bi-stable cell, however, always collapses to one state or the other (0 or 1) following release of the meta-stability, and then remains in that state until meta-stability is again enforced through operation of the tri-state buffer 406. Thus, it makes senses to only take one sample of the output 420 of the bi-stable cell following release of the meta-stability since the result will not change again (i.e., the bi-stable cell is locked in a stable state).

To perform a stuck-at-1 fault test on the bi-stable cell, the SA1 flip flop and synchronizer 424 are initialized to a value of 1 as explained previously by the FSM 108. Then, the cell is repeatedly operated to produce a bit, that is, operated in the metastable state, release of the metastable state to produce a stable output bit, detection of the output bit, again operated in the metastable state, release of the metastable state to produce a stable output bit, detection of the output bit, and so on. The synchronizer 424 and SA1 flip flop is initialized only once for the stuck-at-1 fault test. If, after a predetermined number of metastable and metastable release operations of the bi-stable cell have been performed (e.g., 20 iterations), the output of the SA1 flip flop has not deviated from its initial value of 1, then the bi-stable cell is deemed to have a stuck-at-1 fault.

The stuck-at-0 fault test works similarly but with the synchronizer 424 and SA0 initialized to a value of 0. The transition delay fault test is performed by counting via the edge counter the number of edges of the cell's output 420 detected over a given period of time. If the bi-stable cell tends to collapse to one state significantly more than to the other state, the edge counter will count a smaller than expected number of edges.

Figure 15:
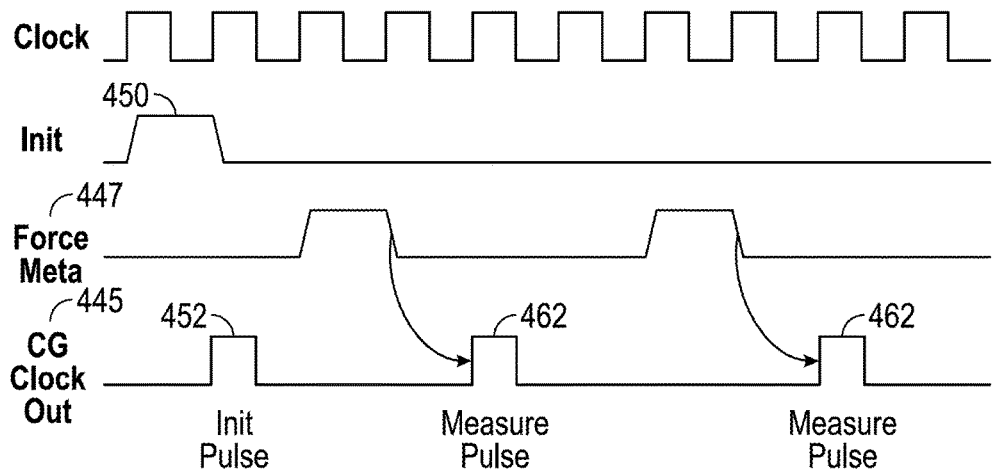
FIG. 15 illustrates a timing diagram associated with the example of FIG. 14.

The embodiment of FIG. 14 also includes a falling edge detector 440, a OR gate 442, and a clock gate 444. The falling edge detector 440 outputs a 1 upon detection of falling edge on its input, which the signal 447 labeled as "Force Meta." The Force Meta signal 447 is generated by the FSM 108 and controls the tri-state buffer 406 within the bi-stable cell of the TRNG 50e. A falling edge of that signal indicates that meta-stability has been released to allow the bi-stable cell to collapse to one of the stable states as explained below. The synchronizer 424 is clocked by a clock signal (CLOCK) which is gated by the clock gate 444. The clock gate 444, which may be implemented using an AND gate, permits the CLOCK signal through to the synchronizer FIG. 15 shows a timing diagram for various signals in the embodiment of FIG. 14. The signals depicted include the CLOCK signal (which is a periodic clock signal), an initialization signal (INIT) generated by the FSM and provided to one of the inputs of OR gate 442, the Force Meta signal 447, and the output signal 445 from the clock gate 444. The INIT pulse permits the clock gate to emit a clock pulse 452 to initialize the synchronizer 424 to perform the stuck-at-0 or stuck-at-1 fault tests as described above. During the repeated measurements of the bi-stable cell's output signal to determine whether the cell has a stuck-at-0 or a stuck-at-1 fault, a single clock pulse 462 is emitted from the clock gate 444 following a falling edge on the Force Meta signal 447 (indicative of release of the meta-stability state).

Figure 16:
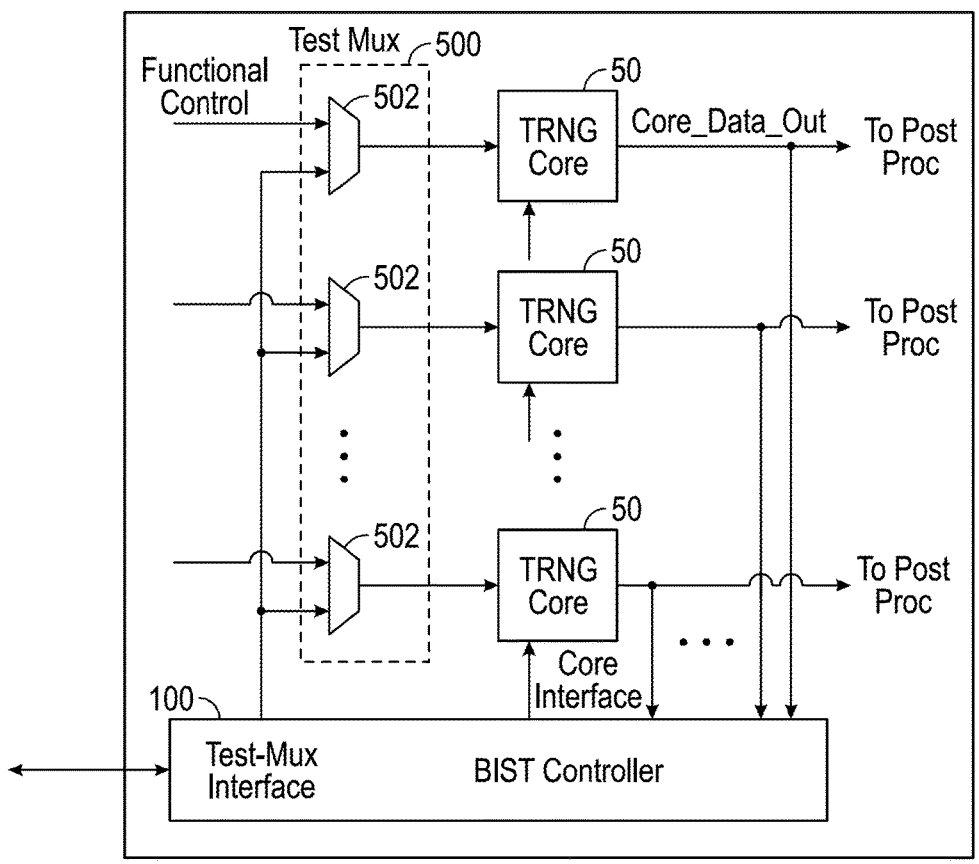
FIG. 16 illustrates a BIST controller coupled to multiple TRNG cores for testing each such core in accordance with various examples.

FIG. 16 illustrates an embodiment in which the BIST controller 100 can be coupled to and thus can test multiple TRNG cores 50. Multiple TRNG cores 50 may be implemented on a die and the BIST controller 100 can be used to perform "stuck at" and transition delay fault testing on each TRNG core. The TRNG cores 50 in this example may all be the same and thus may be implemented as any of the TRNG cores described above, or a different TRNG implementation. Alternatively, the various TRNG cores 50 may comprise a mix of different TRNG implementations. For example, one TRNG core 50 may comprise a multiple parallel ring oscillator, another core may comprise a metastable ring oscillator, another core may comprise a Fibonacci ring oscillator, and so on. Any mix of different types of entropy sources can be used within a single TRNG core. Multiple entropy sources within a single TRNG core may be couple to an XOR tree to mix up their entropy and the FSM 108 can control masking logic for the XOR tree similar to that described above with regard to FIG. 3. This embodiment also includes a test multiplexer circuit 500 which may include a multiplexer 502 for each TRNG core 50. Each multiplexer 502 selectively permits either functional control signals through to the corresponding TRNG core to operate the core during runtime (i.e., not for testing) or control signals from the BIST controller 100 for the various fault testing as described above. The BIST controller 100 may sequentially test each TRNG core 50 or may test the various cores concurrently.

In some embodiments, the BIST controller 100 may be configured to implement a stop-on-fail (breakpoint) mode during testing. In this mode, the execution of the testing process may stop once a configurable number of failures have occurred. Upon cessation of the test, the full diagnostic information can be retrieved by the external computing device 80 from the BIST controller, including an identifier of the particular TRNG core that experienced the failure(s), the particular entropy source within the core that faulted, and even the particular element within that entropy source (e.g., ring/tap under test if based on a ring oscillator) that has failed.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device, comprising:
   a plurality of random number generator (RNG) cores; and
   a built-in self-test (BIST) controller coupled to each RNG core and comprising a detector, a status capture circuit, and a finite state machine circuit;
   wherein the finite state machine circuit is configured to initialize each RNG core and the detector for a stuck-at-1 fault test, a stuck-at-0 fault test, and a transition delay fault test;
   wherein the detector is configured to receive an output signal from each RNG core and to generate a stuck-at-1 output signal indicative of whether the respective RNG core has a stuck-at-1 fault, a stuck-at-0 output signal indicative of whether the respective RNG core has a stuck-at-0 fault, and an edge count output signal indicative of whether the respective RNG core has a transition delay fault and wherein the detector is further configured to provide the stuck-at-1, stuck-at-0, and transition delay fault output signals to the status capture circuit.

2. The device of claim 1, wherein the detector comprises a stuck-at-1 detector configured to generate the stuck-at-1 output signal, a stuck-at-0 detector configured to generate the stuck-at-0 output signal, and an edge counter configured to count signal edges of the output signal from the respective RNG core.

3. The device of claim 1, wherein the BIST controller includes a mask register and a plurality of logic gates, and wherein:
   a first RNG core of the plurality of RNG cores includes a plurality of ring oscillator and synchronizer pairs, and each ring oscillator and synchronizer pair is coupled to an XOR-tree circuit;
   each logic gate is configured to select or deselect a corresponding ring oscillator based on a signal from the mask register; and
   the finite state machine is configured to write a binary value to the mask register to select a particular ring oscillator of the first RNG core for performance of the stuck-at-1 fault test, the stuck-at-0 fault test, and the transition delay fault test.

4. The device of claim 1, wherein the BIST controller includes a selection register, and wherein:
a first RNG core of the plurality of RNG cores includes a plurality of inverters and multiplexers coupled in series, wherein each multiplexer is configurable to selectively operate a corresponding inverter in a feedback mode and in a bypass mode; and
the selection register is configured to assert a control signal to one of the multiplexers of the first RNG core to operate the corresponding inverter in the feedback mode to thereby perform the stuck-at-1 fault test, the stuck-at-0 fault test, and the transition delay fault test on that particular inverter and to assert control signals to the other multiplexers to operate their corresponding inverters in the bypass mode.

5. The device of claim 1, wherein the BIST controller includes a selection register and a feedback XOR gate, and wherein:
a first RNG core of the plurality of RNG cores includes a plurality of inverters coupled in series and feedback taps between adjacent pairs of series coupled inverters, each feedback tap including a switch coupled to a corresponding XOR gate; and
the selection register is configured to assert control signals to the switches of the first RNG core and to the feedback XOR gate to perform the stuck-at-1 fault test, the stuck-at-0 fault test, and the transition delay fault test for each feedback tap with the multiplexer being set to select its inverting input for testing an even feedback tap and to select its non-inverting input for testing an odd feedback tap.

6. The device of claim 1, wherein a first RNG core of the plurality of RNG cores comprises a bi-stable cell.

7. A device, comprising:
a random number generator (RNG) core; and
a built-in self-test (BIST) controller coupled to the RNG core and comprising a detector, a status capture circuit, and a finite state machine circuit;
wherein the finite state machine circuit is configured to cause signals to be asserted to the RNG core and to the detector to initialize the RNG core and the detector for a stuck-at-1 fault test, a stuck-at-0 fault test, and a transition delay fault test;
wherein the detector is configured to receive an output signal from the RNG core and to generate a stuck-at-1 output signal indicative of whether the RNG core has a stuck-at-1 fault, a stuck-at-0 output signal indicative of whether the RNG core has a stuck-at-0 fault, and an edge count output signal indicative of whether the RNG core has a transition delay fault and to provide the stuck-at-1, stuck-at-0, and transition delay fault output signals to the status capture circuit.

8. The device of claim 7, wherein the detector comprises a stuck-at-1 logic circuit configured to generate the stuck-at-1 output signal, a stuck-at-0 logic circuit configured to generate the stuck-at-0 output signal, and an edge counter configured to count signal edges of the output signal from the RNG core.

9. The device of claim 7, wherein the BIST controller includes a mask register and a plurality of logic gates, and wherein:
the RNG core includes a plurality of ring oscillator and synchronizer pairs, and each ring oscillator and synchronizer pair is coupled to an XOR-tree circuit;
each logic gate is configured to select or deselect a corresponding ring oscillator based on a signal from the mask register; and
the finite state machine is configured to write a binary value to the mask register to select a particular ring oscillator of the RNG core for performance of the stuck-at-1 fault test, the stuck-at-0 fault test, and the transition delay fault test.

10. The device of claim 7, wherein the BIST controller includes a selection register, and wherein:
the RNG core includes a plurality of inverters and multiplexers coupled in series, wherein each multiplexer is configurable to selectively operate a corresponding inverter in a feedback mode and in a bypass mode; and
the selection register is configured to assert a control signal to one of the multiplexers of the RNG core to operate the corresponding inverter in the feedback mode to thereby perform the stuck-at-1 fault test, the stuck-at-0 fault test, and the transition delay fault test on that particular inverter and to assert control signals to the other multiplexers to operate their corresponding inverters in the bypass mode.

11. The device of claim 7, wherein the BIST controller includes a selection register, and wherein:
the RNG core includes a plurality of inverters coupled in series and feedback taps between adjacent pairs of series coupled inverters, each feedback tap including a switch coupled to an XOR gate; and
the selection register is configured to assert control signals to the switches of the RNG core to perform the stuck-at-1 fault test, the stuck-at-0 fault test, and the transition delay fault test for each feedback tap.

12. The device of claim 11, wherein the BIST controller includes an XOR gate that is coupled to the tap to be tested, wherein the selection register is configured to control a state of the multiplexer.

13. The device of claim 12, wherein the selection register causes a logic 1 to be provided to the XOR gate during any of the fault tests when testing a tap comprising an even number of inverters within the RNG core and causes a logic 0 to be provided to the XOR gate during any of the fault tests when testing a tap comprising an odd number of inverters with the RNG core.

14. The device of claim 7, wherein the RNG core comprises a bi-stable cell.

15. The device of claim 7, wherein the finite state machine circuit is configured to:
initialize an output of a first flip flop to logic 1 and a synchronizer of a ring oscillator included in the RNG core to a logic 1 for performance of the stuck-at-1 fault test;
initialize an output of a second flip flop to logic 0 and the synchronizer of the ring oscillator to a logic 0 for performance of the stuck-at-0 fault test; and
initialize an edge counter to a 0 count value for performance of the transition delay fault test.

16. A method, comprising:
writing a binary value to a register;
in response to the binary value being written to the register, configuring a random number generator (RNG) circuit for testing of an entropy source within the RNG core;
initializing a synchronizer coupled to the entropy source and a detector to which an output signal from the synchronizer is coupled for a test to determine if the entropy source is experiencing a stuck bit fault;

determining whether the entropy source fails the stuck bit fault test;

initializing an edge counter for a test to determine if the entropy source is experiencing a transition delay fault; and determining whether the entropy source fails the transition delay test.

17. The method of claim 16, wherein:

initializing the synchronizer and the detector comprises initializing the synchronizer and the detector to a first logic state to perform a stuck-at a first logic state test, and then initializing the synchronizer and the detector to a second logic state to perform a stuck-at a second logic state test; and determining whether the entropy source fails the stuck bit fault test comprises determining whether the entropy source fails the stuck-at a first logic state test and determining whether the entropy source fails the stuck-at a second logic state test.

18. The method of claim 16, wherein configuring the RNG core comprises configuring one of a plurality of entropy sources with the RNG core for testing.

19. The method of claim 16, wherein:

writing the binary value to the register comprises writing a multi-bit binary value, wherein each bit of the multi-bit binary value corresponds to a logic state of a logic gate, switch or multiplexer within the RNG core; and configuring the RNG core comprises asserting control signals to the corresponding logic gate, switch or multiplexer to form the entropy source to be tested.

20. The method of claim 16, further comprising repeatedly writing binary values to the register and configuring the RNG core for testing a plurality of entropy sources with the RNG core.

* * * * *